(12) United States Patent
Tozawa et al.

(10) Patent No.: US 11,631,521 B2
(45) Date of Patent: Apr. 18, 2023

(54) ELECTRONIC COMPONENT

(71) Applicant: TDK CORPORATION, Tokyo (JP)

(72) Inventors: Yoji Tozawa, Tokyo (JP); Takuo Abe, Tokyo (JP); Yuma Ishikawa, Tokyo (JP); Hidekazu Sato, Tokyo (JP); Takashi Endo, Tokyo (JP); Masashi Shimoyasu, Tokyo (JP); Kazuma Takahashi, Tokyo (JP)

(73) Assignee: TDK CORPORATION, Tokyo (JP)

(*) Notice: Subject to any disclaimer, the term of this patent is extended or adjusted under 35 U.S.C. 154(b) by 1024 days.

(21) Appl. No.: 16/396,913

(22) Filed: Apr. 29, 2019

(65) Prior Publication Data

US 2019/0348212 A1    Nov. 14, 2019

(30) Foreign Application Priority Data

May 8, 2018    (JP) .............................. JP2018-089815

(51) Int. Cl.
| | | |
|---|---|---|
| *H01F 27/28* | (2006.01) | |
| *H03H 1/00* | (2006.01) | |
| *H03H 7/09* | (2006.01) | |
| *H01F 41/04* | (2006.01) | |
| *H01F 27/29* | (2006.01) | |

(52) U.S. Cl.
CPC ......... *H01F 27/2804* (2013.01); *H01F 27/29* (2013.01); *H01F 41/042* (2013.01); *H03H 1/00* (2013.01); *H03H 7/09* (2013.01); *H01F 2027/2809* (2013.01); *H03H 2001/0085* (2013.01); *H03H 2001/0092* (2013.01)

(58) Field of Classification Search
CPC .... H01F 27/2804; H01F 27/29; H01F 41/042; H01F 2027/2809; H03H 1/00; H03H 7/09; H03H 2001/0085; H03H 2001/0092
See application file for complete search history.

(56) References Cited

U.S. PATENT DOCUMENTS

| | | | |
|---|---|---|---|
| 6,381,117 B1 | 4/2002 | Nakagawa et al. | |
| 2013/0242457 A1 | 9/2013 | Lee et al. | |
| 2014/0204502 A1 | 7/2014 | Chun et al. | |
| 2017/0186538 A1* | 6/2017 | Ando | H01G 4/30 |

FOREIGN PATENT DOCUMENTS

| | | |
|---|---|---|
| CN | 103310977 A | 9/2013 |
| EP | 2 923 366 A1 | 9/2015 |
| EP | 3 343 576 A2 | 7/2018 |

(Continued)

*Primary Examiner* — Adam D Houston
(74) *Attorney, Agent, or Firm* — Oliff PLC

(57) ABSTRACT

An electronic component includes an element body and an external electrode disposed on the element body. The external electrode includes an underlying metal layer, a conductive resin layer, and a plating layer. The underlying metal layer is disposed on the element body. The conductive resin layer contains a plurality of conductive fillers and is disposed on the underlying metal layer. The plating layer is disposed on the conductive resin layer. A part of the plurality of conductive fillers is sintered with the underlying metal layer and is coupled to the underlying metal layer. Another part of the plurality of conductive fillers is exposed to a surface of the conductive resin layer and is in contact with the plating layer.

6 Claims, 9 Drawing Sheets

(56) References Cited

FOREIGN PATENT DOCUMENTS

| | | | | |
|---|---|---|---|---|
| JP | H07183105 A | * | 7/1995 | |
| JP | 2001-076957 A | | 3/2001 | |
| JP | 2014-143387 A | | 8/2014 | |
| JP | 2016-502273 A | | 1/2016 | |
| JP | 2017-152556 A | | 8/2017 | |
| JP | 2018032788 A | * | 3/2018 | |
| JP | 2018032788 A | * | 3/2018 | ............. H01G 4/012 |
| KR | 20160040844 A | * | 4/2016 | |
| WO | 2014/081666 A1 | | 5/2014 | |

* cited by examiner

ELECTRONIC COMPONENT

BACKGROUND OF THE INVENTION

1. Field of the Invention

The present invention relates to an electronic component.

2. Description of Related Art

Known electronic components include an element body and an external electrode disposed on the element body (see, for example, Japanese Unexamined Patent Publication No. 2014-143387). The external electrode includes an underlying metal layer, a conductive resin layer, and a plating layer. The underlying metal layer is disposed on the element body. The conductive resin layer is disposed on the underlying metal layer. The plating layer is disposed on the conductive resin layer. The conductive resin layer includes a plurality of conductive fillers.

SUMMARY OF THE INVENTION

In a case in which the electronic component is mounted on an electronic device, external force applied onto the electronic component from the electronic device may act as stress on the external electrode. In a case in which the electronic device is a substrate, for example, the external force acts on the electronic component as the substrate bends. The underlying metal layer and the conductive resin layer may delaminate at an interface between the underlying metal layer and the conductive resin layer due to the stress acting on the external electrode.

An object of one aspect of the present invention is to provide an electronic component that suppresses occurrence of interfacial delamination between an underlying metal layer and a conductive resin layer.

An electronic component according to one aspect of the present invention includes an element body and an external electrode disposed on the element body. The external electrode includes an underlying metal layer, a conductive resin layer, and a plating layer. The underlying metal layer is disposed on the element body. The conductive resin layer contains a plurality of conductive fillers and is disposed on the underlying metal layer. The plating layer is disposed on the conductive resin layer. A part of the plurality of conductive fillers is sintered with the underlying metal layer and is coupled to the underlying metal layer. Another part of the plurality of conductive fillers is exposed to a surface of the conductive resin layer and is in contact with the plating layer.

In the one aspect, the part of the plurality of conductive fillers is sintered with the underlying metal layer and is coupled to the underlying metal layer. Therefore, the one aspect has high connection strength between the underlying metal layer and the conductive resin layer, as compared with a configuration in which conductive fillers are not sintered with an underlying metal layer and are not coupled to the underlying metal layer. Consequently, the one aspect tends not to have interfacial delamination between the underlying metal layer and the conductive resin layer.

In the one aspect, the underlying metal layer and the plurality of conductive fillers may be made of a same metal.

A configuration in which an underlying metal layer and a plurality of conductive fillers are made of different metals may cause the following problem. An alloy layer is formed between the underlying metal layer and the conductive filler when the underlying metal layer is sintered with the conductive filler. The alloy layer increases electric resistance between the underlying metal layer and the conductive resin layer.

In the configuration in which the underlying metal layer and the plurality of conductive fillers are made of the same metal, the alloy layer tends not to be formed between the underlying metal layer and the conductive filler. Therefore, this configuration suppresses an increase in electric resistance between the underlying metal layer and the conductive resin layer.

In this configuration, the underlying metal layer and the plurality of conductive fillers may be made of Ag.

In the one aspect, the element body may include a principal surface arranged to constitute a mounting surface. In this case, the underlying metal layer may be not disposed on the principal surface.

The conductive resin layer reduces the external force acting on the element body, the external force being applied onto the electronic component from the electronic device. Therefore, the conductive resin layer suppresses occurrence of a crack in the element body. However, in the case in which the part of the plurality of conductive fillers is coupled to the underlying metal layer, an external force tends to act on the underlying metal layer. The external force acting on the underlying metal layer acts as stress on the element body. The stress acting on the element body tends to concentrate on an edge of the underlying metal layer. In the case in which the underlying metal layer is disposed on the mounting surface, a crack may occur in the element body, with an origin of the crack being the edge of the underlying metal layer.

In the configuration in which the underlying metal layer is not disposed on the principal surface, the edge of the underlying metal layer is not located on the principal surface. Therefore, the origin of the crack tends not to exist on the mounting surface. Consequently, this configuration reliably suppresses occurrence of a crack in the element body.

In the one aspect, the conductive resin layer may be disposed on the principal surface.

In this configuration, the external force applied onto the electronic component from the electronic device tends not to act on the mounting surface. Therefore, this configuration more reliably suppresses the occurrence of the crack in the element body.

The one aspect may include an amorphous glass layer formed on a surface of the element body. In this case, the amorphous glass layer may be disposed between an edge of the conductive resin layer and the surface of the element body, and may be in contact with the edge of the conductive resin layer.

This configuration suppresses delamination of the conductive resin layer, as compared with a configuration in which an edge of the conductive resin layer is directly disposed on the element body.

The present invention will become more fully understood from the detailed description given hereinafter and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF EMBODIMENTS

Figure 1:
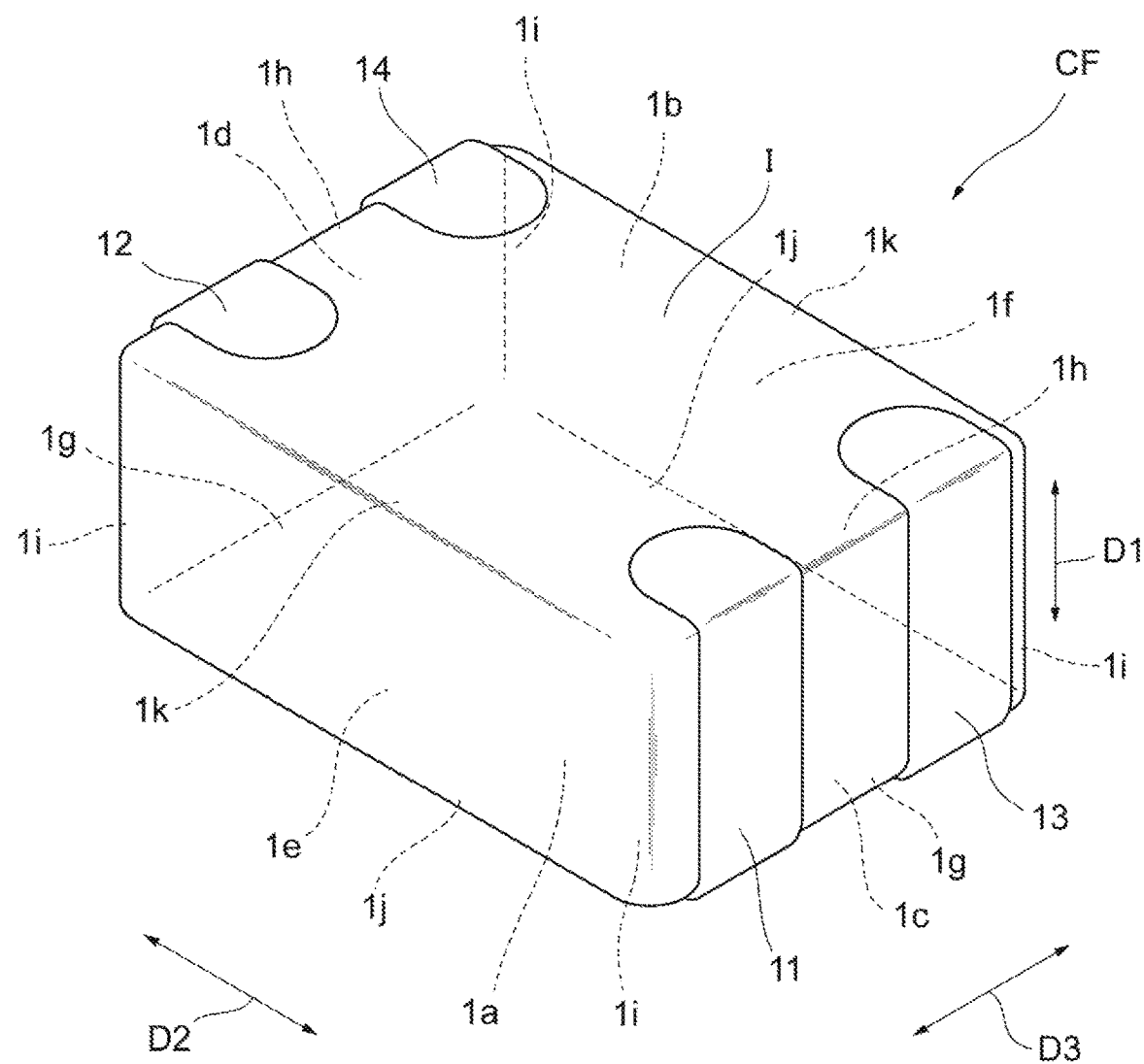
FIG. 1 is a perspective view illustrating a multilayer common mode filter according to an embodiment.

Hereinafter, embodiments of the present invention will be described in detail with reference to the accompanying drawings. In the following description, the same elements or elements having the same functions are denoted with the same reference numerals and overlapped explanation is omitted.

Figure 2:
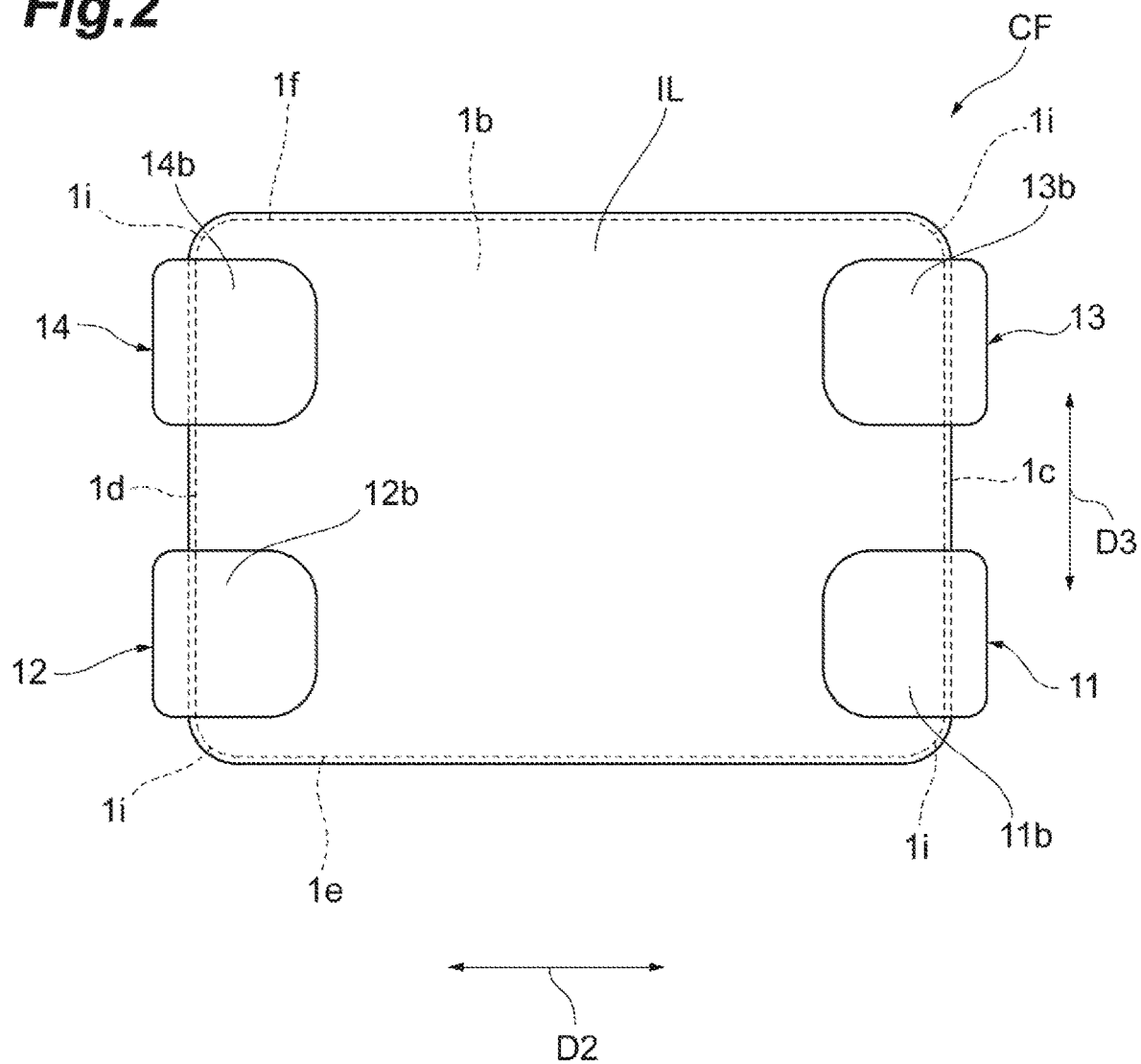
FIG. 2 is a plan view illustrating the multilayer common mode filter according to the embodiment.
Figure 3:
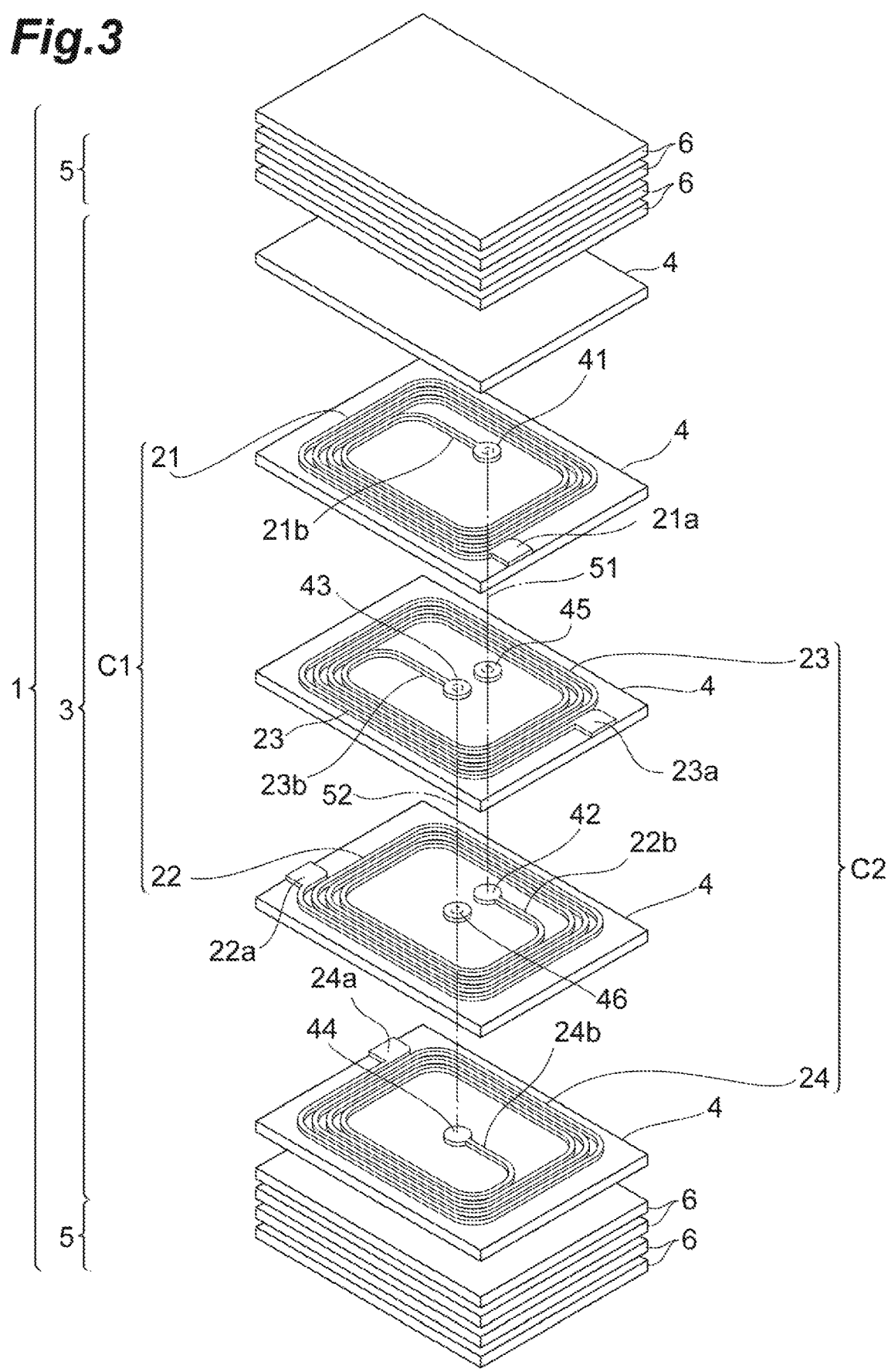
FIG. 3 is an exploded perspective view illustrating a configuration of an element body.
Figure 4:
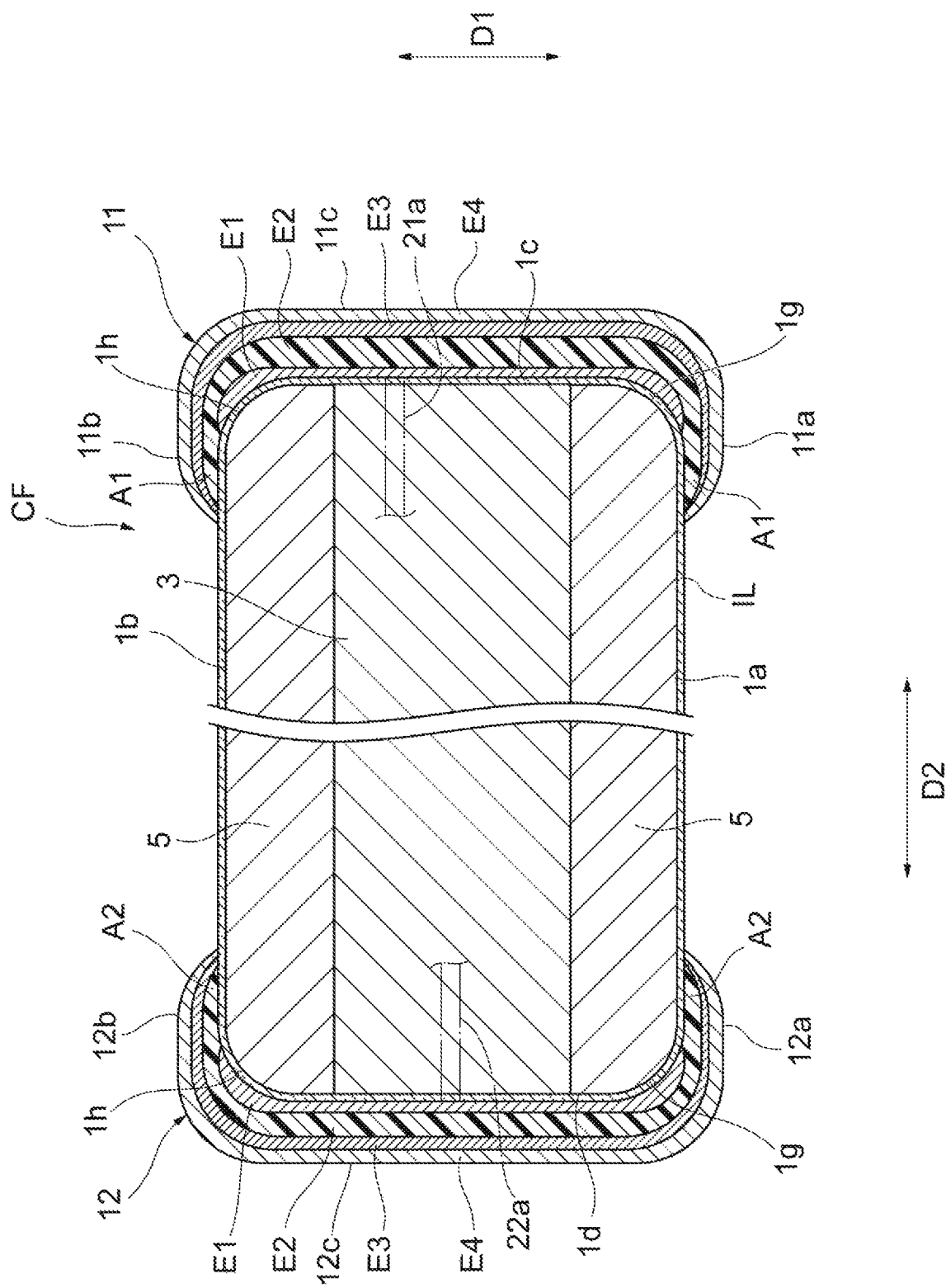
FIG. 4 is a view illustrating a cross-sectional configuration of the multilayer common mode filter according to the embodiment.
Figure 5:
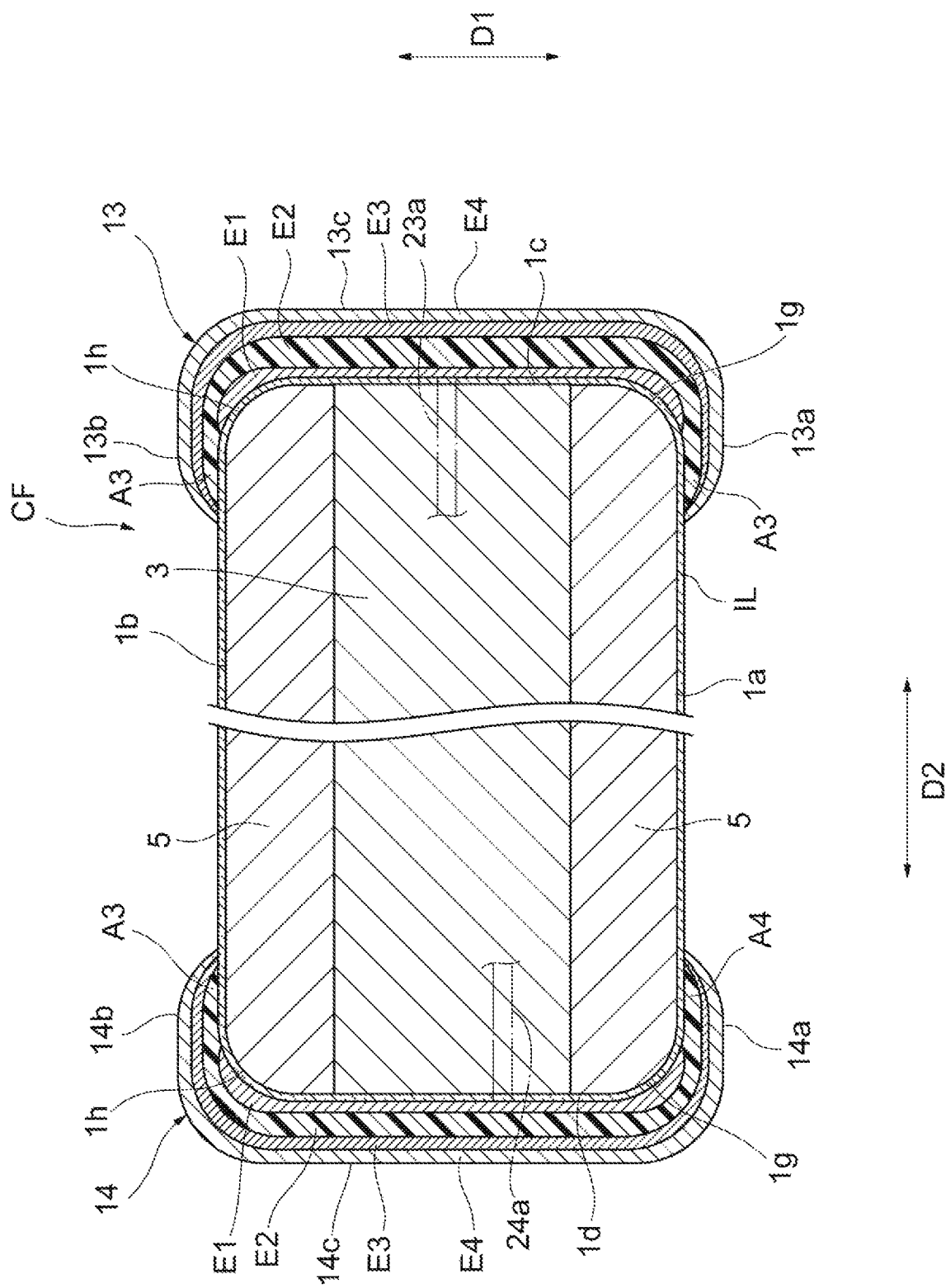
FIG. 5 is a view illustrating a cross-sectional configuration of the multilayer common mode filter according to the embodiment.
Figure 6:
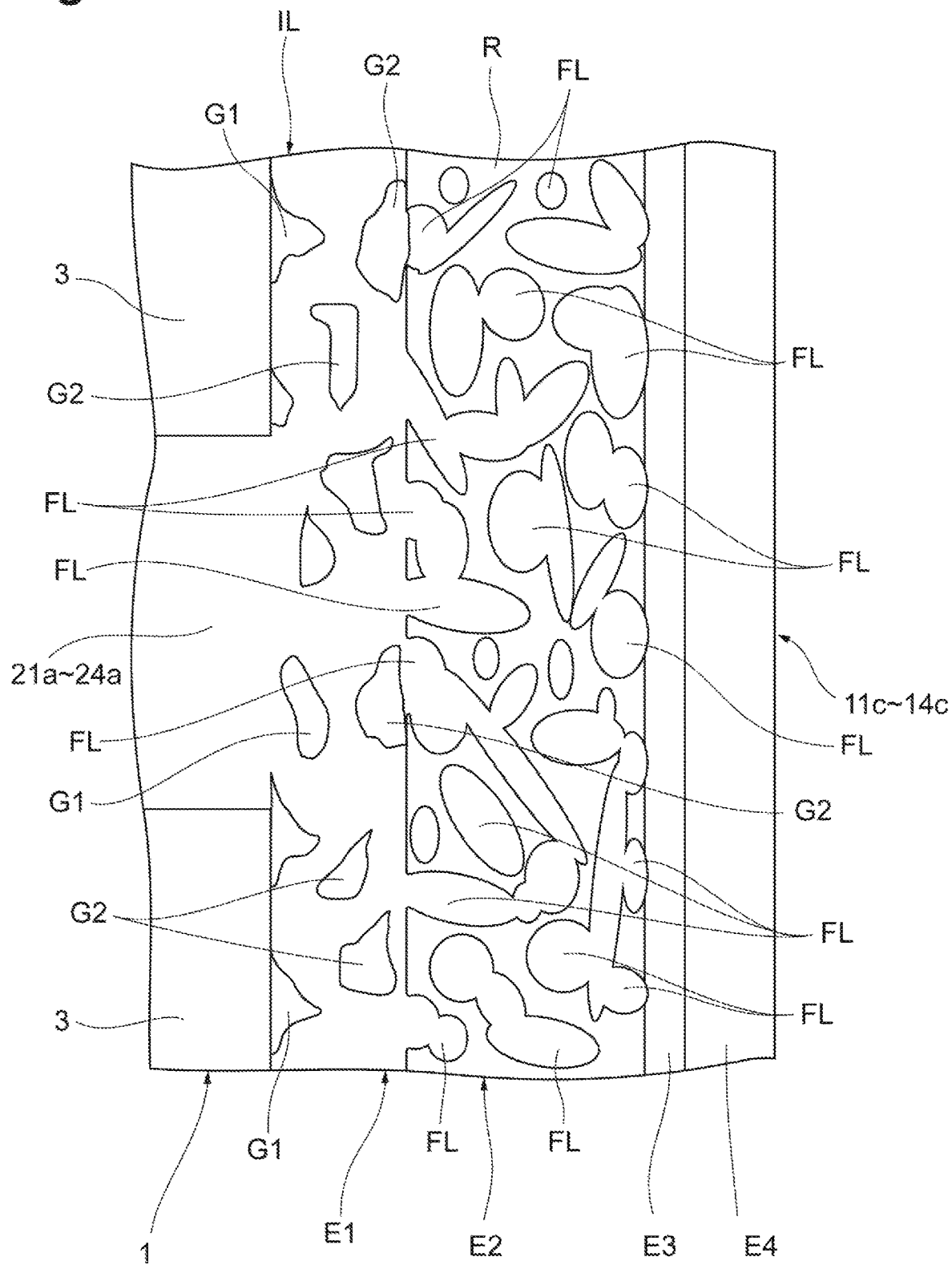
FIG. 6 is a view illustrating a cross-sectional configuration of an external electrode.

A configuration of a multilayer common mode filter CF according to an embodiment will be described with reference to FIGS. 1 to 6. FIG. 1 is a perspective view illustrating a multilayer common mode filter according to the embodiment. FIG. 2 is a plan view illustrating the multilayer common mode filter according to the embodiment. FIG. 3 is an exploded perspective view illustrating a configuration of an element body. FIGS. 4 and 5 are views illustrating cross-sectional configurations of the multilayer common mode filter according to the embodiment. FIG. 6 is a view illustrating a cross-sectional configuration of an external electrode. In FIG. 6, hatching representing a cross section is omitted. In the present embodiment, an electronic component is the multilayer common mode filter CF, for example.

As illustrated in FIGS. 1 to 5, the multilayer common mode filter CF includes an element body 1 and an external electrode. The external electrode includes a plurality of terminal electrodes 11, 12, 13, and 14. In the present embodiment, the external electrode includes the four terminal electrodes 11, 12, 13, and 14. The multilayer common mode filter CF includes the element body 1, the terminal electrode 11, the terminal electrode 12, the terminal electrode 13, and the terminal electrode 14. The terminal electrodes 11, 12, 13, and 14 are separated from one another. The multilayer common mode filter CF is solder-mounted on an electronic device in such a manner that the terminal electrode 11, the terminal electrode 12, the terminal electrode 13, and the terminal electrode 14 are separately connected to signal lines. The electronic device includes, for example, a circuit board or an electronic component.

The element body 1 has a rectangular parallelepiped shape. The element body 1 includes a principal surface 1a and a principal surface 1b opposing each other, a side surface 1c and a side surface 1d opposing each other, and a side surface 1e and a side surface 1f opposing each other. The multilayer common mode filter CF is solder-mounted on the electronic device as described above. In the multilayer common mode filter CF, the principal surface 1a or the principal surface 1b is arranged to constitute a mounting surface opposing the electronic device. The principal surface 1a or the principal surface 1b is the mounting surface.

A direction in which the principal surface 1a and the principal surface 1b oppose each other is a first direction D1. A direction in which the side surface 1c and the side surface 1d oppose each other is a second direction D2. A direction in which the side surface 1e and the side surface 1f oppose each other is a third direction D3. In the present embodiment, the first direction D1 is a height direction of the element body 1. The second direction D2 is a longitudinal direction of the element body 1. The third direction D3 is a width direction of the element body 1. The rectangular parallelepiped shape includes a shape of a rectangular parallelepiped in which a corner portion and a ridge portion are chamfered and a shape of a rectangular parallelepiped in which a corner portion and a ridge portion are rounded.

The side surface 1c and the side surface 1d extend in the first direction D1 in such a manner as to couple the principal surface 1a and the principal surface 1b. The side surface 1c and the side surface 1d are adjacent to the principal surface 1a and are also adjacent to the principal surface 1b. The side surface 1c and the side surface 1d also extend in the third direction D3. The third direction D3 is also a short side direction of the principal surface 1a and the principal surface 1b. The side surface 1e and the side surface 1f extend in the first direction D1 in such a manner as to couple the principal surface 1a and the principal surface 1b. The side surface 1e and the side surface 1f are adjacent to the principal surface 1a and are also adjacent to the principal surface 1b. The side surface 1e and the side surface 1f also extend in the second direction D2. The second direction D2 is also a long side direction of the principal surface 1a and the principal surface 1b.

The element body 1 includes a pair of ridge portions 1g, a pair of ridge portions 1h, four ridge portions 1i, a pair of ridge portions 1j, and a pair of ridge portions 1k. The ridge portions 1g are positioned between the principal surface 1a and the side surfaces 1c and 1d. The ridge portions 1h are positioned between the principal surface 1b and the side surfaces 1c and 1d. Each of the ridge portions 1i is positioned between the two side surfaces 1c, 1d, 1e, and 1f adjacent to each other. The ridge portions 1j are positioned between the principal surface 1a and the side surfaces 1e and 1f. The ridge portions 1k are positioned between the principal surface 1b and the side surface 1e and 1f. In the present embodiment, each of the ridge portions 1g, 1h, 1i, 1j, and 1k is rounded to curve. The element body 1 is subject to what is called a round chamfering process. Each of the ridge portions 1g, 1h, 1i, 1j, and 1k includes a curved surface having a predetermined radius of curvature. In the present embodiment, the radii of curvature of the ridge portions 1g, 1h, 1i, 1j, and 1k (curved surfaces) are approximately equivalent to each other. The radii of curvature of the ridge portions 1g, 1h, 1i, 1j, and 1k (curved surfaces) may be different from each other.

The principal surface 1a and each of the side surfaces 1c and 1d are indirectly adjacent to each other with the ridge portion 1g between the principal surface 1a and each of the side surfaces 1c and 1d. The principal surface 1b and each of the side surfaces 1c and 1d are indirectly adjacent to each other with the ridge portion 1h between the principal surface 1b and each of the side surfaces 1c and 1d. Each of the side surfaces 1c and 1d and each of the side surfaces 1e and 1f are indirectly adjacent to each other with the ridge portion 1i between each of the side surfaces 1c and 1d and each of the side surfaces 1e and 1f. The principal surface 1a and each of the side surfaces 1e and 1f are indirectly adjacent to each other with the ridge portion 1j between the principal surface 1a and each of the side surfaces 1e and 1f. The principal surface 1b and each of the side surfaces 1e and 1f are indirectly adjacent to each other with the ridge portion 1k between the principal surface 1b and each of the side surfaces 1e and 1f.

The element body 1 includes a non-magnetic portion 3 and a pair of magnetic portions 5. The pair of magnetic portions 5 is disposed in such a manner that the non-magnetic portion 3 is positioned between the pair of magnetic portions 5 in the first direction D1. The element body 1 includes a plurality of laminated insulating layers. In the non-magnetic portion 3, a plurality of non-magnetic layers 4 are laminated. The non-magnetic portion 3 includes the plurality of laminated non-magnetic layers 4. In each of the magnetic portions 5, a plurality of magnetic layers 6 are laminated. Each of the magnetic portions 5 includes the plurality of laminated magnetic layers 6. The plurality of insulating layers includes the plurality of non-magnetic layers 4 and the plurality of magnetic layers 6.

Each of the non-magnetic layers 4 is configured by a sintered body of a ceramic green sheet including a non-magnetic material, for example. The non-magnetic material is a Cu—Zn based ferrite material, a dielectric material, or a glass ceramic material, for example. Each of the magnetic layers 6 is configured by a sintered body of a ceramic green sheet including a magnetic material, for example. The magnetic material is a Ni—Cu—Zn based ferrite material, a Ni—Cu—Zn—Mg based ferrite material, or a Ni—Cu based ferrite material, for example. In the actual element body 1, the non-magnetic layers 4 and the magnetic layers 6 are integrated in such a manner that inter-layer boundaries cannot be visualized. The first direction D1 (the direction in which the principal surface 1a and the principal surface 1b oppose each other) is matched with a direction in which the plurality of insulating layers (the plurality of non-magnetic layers 4 and the plurality of magnetic layers 6) is laminated.

The multilayer common mode filter CF includes an amorphous glass layer IL. The amorphous glass layer IL is formed on a surface of the element body 1. The amorphous glass layer IL covers the element body 1 (the non-magnetic portion 3 and the magnetic portions 5). The amorphous glass layer IL is in contact with the surface (the principal surfaces 1a and 1b, the side surfaces 1c, 1d, 1e, and 1f, and the ridge portions 1g, 1h, 1i, 1j, and 1k) of the element body 1. The amorphous glass layer IL covers the principal surfaces 1a and 1b, the side surfaces 1c, 1d, 1e, and 1f, and the ridge portions 1g, 1h, 1i, 1j, and 1k. The amorphous glass layer IL covers the entire surface of the element body 1. Surfaces of the magnetic portions 5 include the principal surfaces 1a and 1b. The amorphous glass layer IL is formed on the surfaces of the magnetic portions 5. Surface roughness of the amorphous glass layer IL is smaller than surface roughness of the magnetic portion 5. The amorphous glass layer IL is made of an amorphous glass material. The amorphous glass material is silica based glass ($SiO_2$—$B_2O_3$—$ZrO_2$—$R_2O$ based glass), for example.

As illustrated in FIG. 3, the multilayer common mode filter CF includes a plurality of coil conductors 21, 22, 23, and 24. The plurality of coil conductors 21, 22, 23, and 24 is disposed in the element body 1. In the present embodiment, the multilayer common mode filter CF includes the four coil conductors 21, 22, 23, and 24. The four coil conductors 21, 22, 23, and 24 are disposed in the non-magnetic portion 3. Each of the coil conductors 21, 22, 23, and 24 is an internal conductor disposed in the element body 1. Each of the coil conductors 21, 22, 23, and 24 includes a conductive material. The conductive material includes, for example, Ag or Pd. Each of the coil conductors 21, 22, 23, and 24 is configured as a sintered body of conductive paste including conductive material powder, for example. The conductive material powder includes, for example, Ag powder or Pd powder.

The coil conductor 21 has a spiral shape. The coil conductor 21 is disposed between a pair of the non-magnetic layers 4 adjacent to each other in the first direction D1. One end (outside end) 21a of the coil conductor 21 is exposed at the side surface 1c. Another end (inside end) 21b of the coil conductor 21 is connected to a pad conductor 41. The pad conductor 41 is located at the same layer as the coil conductor 21. In the present embodiment, the coil conductor 21 and the pad conductor 41 are integrally formed.

The coil conductor 22 has a spiral shape. The coil conductor 22 is disposed between a pair of the non-magnetic layers 4 adjacent to each other in the first direction D1. One end (outside end) 22a of the coil conductor 22 is exposed at the side surface 1d. Another end (inside end) 22b of the coil conductor 22 is connected to a pad conductor 42. The pad conductor 42 is located at the same layer as the coil conductor 22. In the present embodiment, the coil conductor 22 and the pad conductor 42 are integrally formed.

The coil conductor 23 has a spiral shape. The coil conductor 23 is disposed between a pair of the non-magnetic layers 4 adjacent to each other in the first direction D1. One end (outside end) 23a of the coil conductor 23 is exposed at the side surface 1c. Another end (inside end) 23b of the coil conductor 23 is connected to a pad conductor 43. The pad conductor 43 is located at the same layer as the coil conductor 23. In the present embodiment, the coil conductor 23 and the pad conductor 43 are integrally formed.

The coil conductor 24 has a spiral shape. The coil conductor 24 is disposed between a pair of the non-magnetic layers 4 adjacent to each other in the first direction D1. One end (outside end) 24a of the coil conductor 24 is exposed at the side surface 1d. Another end (inside end) 24b of the coil conductor 24 is connected to a pad conductor 44. The pad conductor 44 is located at the same layer as the coil conductor 24. In the present embodiment, the coil conductor 24 and the pad conductor 44 are integrally formed.

The coil conductor 21 and the coil conductor 23 are adjacent to each other in the first direction D1 in a state where the non-magnetic layer 4 is interposed between the coil conductor 21 and the coil conductor 23. The non-magnetic layer 4 is sandwiched between the coil conductor 21 and the coil conductor 23. The coil conductor 22 and the coil conductor 24 are adjacent to each other in the first direction D1 in a state where the non-magnetic layer 4 is interposed between the coil conductor 22 and the coil conductor 24. The non-magnetic layer 4 is sandwiched between the coil conductor 22 and the coil conductor 24. The coil conductor 23 is positioned between the coil conductor 21 and the coil conductor 22 in the first direction D1. The four coil conductors 21, 22, 23, and 24 are disposed in the order of the coil conductor 21, the coil conductor 23, the coil conductor 22, and the coil conductor 24 in the first direction D1. The coil conductors 21, 22, 23, and 24 are wound in the same direction and are positioned to overlap each other, when viewed from the first direction D1.

The pad conductor 41 and the pad conductor 42 are positioned to overlap each other when viewed from the first direction D1. A pad conductor 45 is disposed between the pad conductor 41 and the pad conductor 42 in such a manner as to overlap the pad conductors 41 and 42 when viewed from the first direction D1. The pad conductor 45 is located at the same layer as the coil conductor 123. The pad conductor 41 and the pad conductor 45 are adjacent to each other in the first direction D1 in a state where the non-magnetic layer 4 is interposed between the pad conductor 41 and the pad conductor 45. The non-magnetic layer 4 is sandwiched between the pad conductor 41 and the pad conductor 45. The pad conductor 45 and the pad conductor 42 are adjacent to each other in the first direction D1 in a state where the non-magnetic layer 4 is interposed between the pad conductor 45 and the pad conductor 42. The non-magnetic layer 4 is sandwiched between the pad conductor 45 and the pad conductor 42.

The pad conductor 41, the pad conductor 45, and the pad conductor 42 are connected through a through-hole conductor 51. The through-hole conductor 51 penetrates the non-magnetic layer 4 positioned between the pad conductor 41 and the pad conductor 45, and the non-magnetic layer 4 positioned between the pad conductor 45 and the pad conductor 42.

The pad conductor 43 and the pad conductor 44 are positioned to overlap each other when viewed from the first direction D1. A pad conductor 46 is disposed between the pad conductor 43 and the pad conductor 44 in such a manner as to overlap the pad conductors 43 and 44 when viewed from the first direction D1. The pad conductor 46 is located at the same layer as the coil conductor 22. The pad conductor 43 and the pad conductor 46 are adjacent to each other in the first direction D1 in a state where the non-magnetic layer 4 is interposed between the pad conductor 43 and the pad conductor 46. The non-magnetic layer 4 is sandwiched between the pad conductor 43 and the pad conductor 46. The pad conductor 46 and the pad conductor 44 are adjacent to each other in the first direction D1 in a state where the non-magnetic layer 4 is interposed between the pad conductor 46 and the pad conductor 44. The non-magnetic layer 4 is sandwiched between the pad conductor 46 and the pad conductor 44.

The pad conductor 43, the pad conductor 46, and the pad conductor 44 are connected through a through-hole conductor 52. The through-hole conductor 52 penetrates the non-magnetic layer 4 positioned between the pad conductor 43 and the pad conductor 46, and the non-magnetic layer 4 positioned between the pad conductor 46 and the pad conductor 44.

The coil conductor 21 and the coil conductor 22 are electrically connected through the pad conductor 41, the pad conductor 45, the pad conductor 42, and the through-hole conductor 51. The coil conductor 21 and the coil conductor 22 configure a coil C1. The coil conductor 23 and the coil conductor 24 are electrically connected through the pad conductor 43, the pad conductor 46, the pad conductor 44, and the through-hole conductor 52. The coil conductor 23 and the coil conductor 24 configure a coil C2.

The multilayer common mode filter CF includes the coil C1 and the coil C2 in the element body 1 (non-magnetic portion 3). The coil C1 and the coil C2 are disposed in the non-magnetic portion 3 in such a manner that the coil conductor 21 and the coil conductor 23 are adjacent to each other in the first direction D1, the coil conductor 23 and the coil conductor 22 are adjacent to each other in the first direction D1, and the coil conductor 22 and the coil conductor 24 are adjacent to each other in the first direction D1. The coil C1 and the coil C2 are arranged to be magnetically coupled to each other.

The pad conductors 45 and 46 and the through-hole conductors 51 and 52 include a conductive material. The conductive material includes, for example, Ag or Pd. The pad conductors 45 and 46 and the through-hole conductors 51 and 52 are configured as a sintered body of conductive paste containing conductive material powder, for example. The conductive material powder includes, for example, Ag powder or Pd powder. The through-hole conductors 51 and 52 are formed by sintering conductive paste filled in through-holes formed in ceramic green sheets that configure the corresponding non-magnetic layers 4, for example.

The terminal electrode 11 and the terminal electrode 13 are disposed on the side surface 1c side of the element body 1. The terminal electrode 11 and the terminal electrode 13 are disposed on one end portion of the element body 1 in the second direction D2. The terminal electrode 11 and the terminal electrode 13 are disposed on the side surface 1c in such a manner as to cover a part of the side surface 1c along the first direction D1, and are disposed on a part of the principal surface 1a and a part of the principal surface 1b. The terminal electrode 11 is positioned close to the side surface 1e. The terminal electrode 13 is positioned close to the side surface 1f. The terminal electrode 11 is disposed on the element body 1 in such a manner that the amorphous glass layer IL is interposed between the terminal electrode 11 and the element body 1. The terminal electrode 13 is disposed on the element body 1 in such a manner that the amorphous glass layer IL is interposed between the terminal electrode 13 and the element body 1. The terminal electrode 11 and the terminal electrode 13 are indirectly disposed on the element body 1.

The terminal electrode 12 and the terminal electrode 14 are disposed on the side surface 1d side of the element body 1. The terminal electrode 12 and the terminal electrode 14 are disposed on another end portion of the element body 1 in the second direction D2. The terminal electrode 12 and the terminal electrode 14 are disposed on the side surface 1d in such a manner as to cover a part of the side surface 1d along the first direction D1, and are disposed on a part of the principal surface 1a and a part of the principal surface 1b. The terminal electrode 12 is positioned close to the side surface 1e. The terminal electrode 14 is positioned close to the side surface 1f. The terminal electrode 12 is disposed on the element body 1 in such a manner that the amorphous glass layer IL is interposed between the terminal electrode 12 and the element body 1. The terminal electrode 14 is disposed on the element body 1 in such a manner that the amorphous glass layer IL is interposed between the terminal electrode 14 and the element body 1. The terminal electrode 12 and the terminal electrode 14 are indirectly disposed on the element body 1.

As illustrated in FIG. 4, the terminal electrode 11 includes a plurality of electrode portions 11a, 11b, and 11c. In the present embodiment, the terminal electrode 11 includes the three electrode portions 11a, 11b, and 11c. The electrode portions 11a, 11b, and 11c are indirectly disposed on the element body 1. The electrode portion 11a is disposed on the principal surface 1a. The electrode portion 11b is disposed on the principal surface 1b. The electrode portion 11c is disposed on the side surface 1c and the ridge portions 1g and 1h. The terminal electrode 11 is not disposed on the side surface 1d, the side surface 1e, the side surface 1f, and the ridge portions 1i, 1j, and 1k. The terminal electrode 11 is disposed only on the three surfaces (principal surfaces 1a and 1b, and side surface 1c). The electrode portions 11a and 11b are disposed on the amorphous glass layer IL, and are in contact with the amorphous glass layer IL.

The electrode portions 11a and 11c adjacent to each other are coupled on the ridge portion 1g, and are electrically connected to each other. The electrode portions 11b and 11c adjacent to each other are coupled on the ridge portion 1h, and are electrically connected to each other. The electrode portion 11c covers the entire end of the coil conductor 21, the end being exposed at the side surface 1c. The coil conductor 21 is connected with the electrode portion 11c at the end exposed at the side surface 1c. The terminal electrode 11 and the coil conductor 21 are electrically connected to each other. The one end 21a of the coil conductor 21 functions as a connection conductor with the terminal electrode 11.

As illustrated in FIG. 4, the terminal electrode 12 includes a plurality of electrode portions 12a, 12b, and 12c. In the present embodiment, the terminal electrode 12 includes the three electrode portions 12a, 12b, and 12c. The electrode portions 12a, 12b, and 12c are indirectly disposed on the element body 1. The electrode portion 12a is disposed on the principal surface 1a. The electrode portion 12b is disposed on the principal surface 1b. The electrode portion 12c is disposed on the side surface 1d and the ridge portions 1g and 1h. The terminal electrode 12 is not disposed on the side surface 1c, the side surface 1e, the side surface 1f, and the ridge portions 1i, 1j, and 1k. The terminal electrode 12 is disposed only on the three surfaces (principal surfaces 1a and 1b, and side surface 1d). The electrode portions 12a and 12b are disposed on the amorphous glass layer IL, and are in contact with the amorphous glass layer IL.

The electrode portions 12a and 12c adjacent to each other are coupled on the ridge portion 1g, and are electrically connected to each other. The electrode portions 12b and 12c adjacent to each other are coupled on the ridge portion 1h, and are electrically connected to each other. The electrode portion 12c covers the entire end of the coil conductor 22, the end being exposed at the side surface 1d. The coil conductor 22 is connected with the electrode portion 12c at the end exposed at the side surface 1d. The terminal electrode 12 and the coil conductor 22 are electrically connected to each other. The one end 22a of the coil conductor 22 functions as a connection conductor with the terminal electrode 12.

As illustrated in FIG. 5, the terminal electrode 13 includes a plurality of electrode portions 13a, 13b, and 13c. In the present embodiment, the terminal electrode 13 includes the three electrode portions 13a, 13b, and 13c. The electrode portions 13a, 13b, and 13c are indirectly disposed on the element body 1. The electrode portion 13a is disposed on the principal surface 1a. The electrode portion 13b is disposed on the principal surface 1b. The electrode portion 13c is disposed on the side surface 1c and the ridge portions 1g and 1h. The terminal electrode 13 is not disposed on the side surface 1d, the side surface 1e, the side surface 1f, and the ridge portions 1i, 1j, and 1k. The terminal electrode 13 is disposed only on the three surfaces (principal surfaces 1a and 1b, and side surface 1c). The electrode portions 13a and 13b are disposed on the amorphous glass layer IL, and are in contact with the amorphous glass layer IL.

The electrode portions 13a and 13c adjacent to each other are coupled on the ridge portion 1g, and are electrically connected to each other. The electrode portions 13b and 13c adjacent to each other are coupled on the ridge portion 1h, and are electrically connected to each other. The electrode portion 13c covers the entire end of the coil conductor 23, the end being exposed at the side surface 1c. The coil conductor 23 is connected with the electrode portion 13c at the end exposed at the side surface 1c. The terminal electrode 13 and the coil conductor 23 are electrically connected to each other. The one end 23a of the coil conductor 23 functions as a connection conductor with the terminal electrode 13.

As illustrated in FIG. 5, the terminal electrode 14 includes a plurality of electrode portions 14a, 14b, and 14c. In the present embodiment, the terminal electrode 14 includes the three electrode portions 14a, 14b, and 14c. The electrode portions 14a, 14b, and 14c are indirectly disposed on the element body 1. The electrode portion 14a is disposed on the principal surface 1a. The electrode portion 14b is disposed on the principal surface 1b. The electrode portion 14c is disposed on the side surface 1d and the ridge portions 1g and 1h. The terminal electrode 14 is not disposed on the side surface 1c, the side surface 1e, the side surface 1f, and the ridge portions 1i, 1j, and 1k. The terminal electrode 14 is disposed only on the three surfaces (principal surfaces 1a and 1b, and side surface 1d). The electrode portions 14a and 14b are disposed on the amorphous glass layer IL, and are in contact with the amorphous glass layer IL.

The electrode portions 14a and 14c adjacent to each other are coupled on the ridge portion 1g, and are electrically connected to each other. The electrode portions 14b and 14c adjacent to each other are coupled on the ridge portion 1h, and are electrically connected to each other. The electrode portion 14c covers the entire end of the coil conductor 24, the end being exposed at the side surface 1d. The coil conductor 24 is connected with the electrode portion 14c at the end exposed at the side surface 1d. The terminal electrode 14 and the coil conductor 24 are electrically connected to each other. The one end 24a of the coil conductor 24 functions as a connection conductor with the terminal electrode 14.

Each of the terminal electrodes 11, 12, 13, and 14 includes a first electrode layer E1, a second electrode layer E2, a third electrode layer E3, and a fourth electrode layer E4. In the present embodiment, each of the electrode portions 11c, 12c, 13c, and 14c includes the first electrode layer E1, the second electrode layer E2, the third electrode layer E3, and the fourth electrode layer E4. Each of the electrode portions 11a, 11b, 12a, 12b, 13a, 13b, 14a, and 14b includes the second electrode layer E2, the third electrode layer E3, and the fourth electrode layer E4. Each of the electrode portions 11a, 11b, 12a, 12b, 13a, 13b, 14a, and 14b does not include the first electrode layer E1. Each of the terminal electrodes 11 and 13 has a four-layer structure on the side surface 1c and the ridge portions 1g and 1h, has a three-layer structure on the principal surfaces 1a and 1b. Each of the terminal electrodes 12 and 14 has a four-layer structure on the side surface 1d and the ridge portions 1g and 1h, has a three-layer structure on the principal surfaces 1a and 1b. The fourth electrode layer E4 configures each of uppermost layers of the terminal electrodes 11, 12, 13, and 14.

The first electrode layer E1 is formed by sintering conductive paste. The first electrode layer E1 is formed by sintering a metal component (metal powder) contained in the conductive paste. The first electrode layer E1 includes an underlying metal layer. In the present embodiment, the first electrode layer E1 includes a sintered metal layer. The first electrode layer E1 is not intentionally formed on the pair of principal surfaces 1a and 1b. The first electrode layer E1 may be unintentionally formed on the principal surfaces 1a and 1b due to a production error, for example. In the present embodiment, the first electrode layer E1 is the underlying metal layer made of Ag. The first electrode layer E1 may be a underlying metal layer made of Pd. The conductive paste includes powder made of Ag or Pd, a glass component, an organic binder, and an organic solvent. The first electrode layer E1 may be formed by a PVD (physical vapor deposition) method or a CVD (chemical vapor deposition) method.

In the present embodiment, the first electrode layer E1 is disposed on the amorphous glass layer IL. The first electrode layer E1 is disposed on the element body 1 in such a manner that the amorphous glass layer IL is interposed between the first electrode layer E1 and the element body 1. In practice, as illustrated in FIG. 6, a glass component G1 contained in the amorphous glass layer IL and a glass component G2 contained in the conductive paste are mixed in the first electrode layer E1. The glass component G1 is made of an amorphous glass material.

The first electrode layer E1 is included in each of the electrode portions 11c, 12c, 13c, and 14c. The first electrode layer E1 included in each of the electrode portions 11c and 13c is disposed on the side surface 1c and the ridge portions 1g and 1h. The first electrode layer E1 included in each of the electrode portions 12c and 14c is disposed on the side surface 1d and the ridge portions 1g and 1h. In the present embodiment, the first electrode layer E1 is not disposed on the principal surfaces 1a and 1b. The one end 21a of the coil conductor 21 penetrates the amorphous glass layer IL and is connected to the first electrode layer E1 included in the electrode portions 11c. The one end 22a of the coil conductor 22 penetrates the amorphous glass layer IL and is connected to the first electrode layer E1 included in the electrode portions 12c. The one end 23a of the coil conductor 23 penetrates the amorphous glass layer IL and is connected to the first electrode layer E1 included in the electrode portion 13c. The one end 24a of the coil conductor 24 penetrates the amorphous glass layer IL and is connected to the first electrode layer E1 included in the electrode portion 14c.

The second electrode layer E2 is formed by curing conductive resin paste applied to cover the first electrode layer E1. The second electrode layer E2 includes a conductive resin layer. The second electrode layer E2 is in contact with first electrode layer E1. As illustrated in FIG. 6, the second electrode layer E2 includes a plurality of conductive fillers FL and a resin R. The conductive filler FL includes, for example, a metal powder. In the present invention, the metal powder includes Ag powder. Therefore, the first electrode layer E1 and the conductive filler FL are made of the same metal. The metal powder may be, for example, Cu powder or Ni powder other than Ag powder. The resin R includes a thermosetting resin. The thermosetting resin is a phenol resin, an acrylic resin, a silicone resin, an epoxy resin, or a polyimide resin, for example. The conductive resin paste includes, for example, the plurality of conductive fillers FL, the thermosetting resin, and an organic solvent.

The second electrode layer E2 is included in each of the electrode portions 11a to 11c, 12a to 12c, 13a to 13c, and 14a to 14c. The second electrode layer E2 is disposed on the first electrode layer E1 and is in contact with the first electrode layer E1, in each of the electrode portions 11c, 12c, 13c, and 14c. The second electrode layer E2 included in each of the electrode portions 11a, 11b, 12a, 12b, 13a, 13b, 14a, and 14b is in contact with the amorphous glass layer IL. The second electrode layer E2 included in each of the electrode portions 11a, 12a, 13a, and 14a is disposed on the principal surface 1a in a state where the amorphous glass layer IL is interposed between the principal surface 1a and the second electrode layer E2. The second electrode layer E2 included in each of the electrode portions 11b, 12ab, 13b, and 14b is disposed on the principal surface 1b in a state where the amorphous glass layer IL is interposed between the principal surface 1b and the second electrode layer E2. The second electrode layer E2 is not directly in contact with the element body 1.

The plurality of conductive fillers FL forms a plurality of conductive paths in the second electrode layer E2. A part of the plurality of conductive fillers FL is sintered with the first electrode layer E1. The conductive filler FL sintered with the first electrode layer E1 is coupled to the first electrode layer E1. Another part of the plurality of conductive fillers FL is exposed to a surface of the second electrode layer E2.

The third electrode layer E3 is formed on the second electrode layer E2 by a plating method. The third electrode layer E3 includes a plating layer. In the present embodiment, the third electrode layer E3 is a Ni plating layer formed by Ni plating method. The third electrode layer E3 may be a Cu plating layer. The third electrode layer E3 includes, for example, Ni or Cu. The third electrode layer E3 is in contact with the second electrode layer E2. The conductive fillers FL exposed to the surface of the second electrode layer E2 is in contact with the third electrode layer E3.

The fourth electrode layer E4 is formed on the third electrode layer E3 by a plating method. The fourth electrode layer E4 includes a plating layer. In the present embodiment, the fourth electrode layer E4 is a Sn plating layer formed by Sn plating method. The fourth electrode layer E4 includes, for example, Sn. The fourth electrode layer E4 is in contact with the third electrode layer E3. The third electrode layer E3 and the fourth electrode layer E4 configure a plating layer disposed on the second electrode layer E2. The entire second electrode layer E2 is covered with the plating layer configured by the third electrode layer E 3 and the fourth electrode layer E 4. In the present embodiment, the plating layer formed on the second electrode layer E2 has a two-layer structure.

The second electrode layer E2 is integrally formed in each of the electrode portions 11a to 11c, 12a to 12c, 13a to 13c, and 14a to 14c. The third electrode layer E3 is integrally formed in each of the electrode portions 11a to 11c, 12a to 12c, 13a to 13c, and 14a to 14c. The fourth electrode layer E4 is integrally formed in each of the electrode portions 11a to 11c, 12a to 12c, 13a to 13c, and 14a to 14c.

The electrode portions 11a, 11b include an edge A1 of the second electrode layers E2, an edge of the third electrode layers E3, and an edge of the fourth electrode layers E4. The electrode portions 12a, 12b include an edge A2 of the second electrode layers E2, an edge of the third electrode layers E3, and an edge of the fourth electrode layers E4. The electrode portions 13a, 13b include an edge A3 of the second electrode layers E2, an edge of the third electrode layers E3, and an edge of the fourth electrode layers E4. The electrode portions 14a, 14b include an edge A4 of the second electrode layers E2, an edge of the third electrode layers E3, and an edge of the fourth electrode layers E4.

The amorphous glass layer IL is positioned between the edges A1, A2, A3, and A4 of the second electrode layers E2 included in the electrode portions 11a, 11b, 12a, 12b, 13a, 13b, 14a, and 14b, and the magnetic portions 5. In the present embodiment, the edges A1, A2, A3, and A4 of the second electrode layers E2 are in contact with the amorphous glass layer IL. The amorphous glass layer IL is disposed between the principal surfaces 1a and 1b, and the edges A1, A2, A3, and A4 of the second electrode layers E2. The amorphous glass layer IL is sandwiched between the principal surfaces 1a and 1b, and the edges A1, A2, A3, and A4 of the second electrode layers E2.

As described above, in the multilayer common mode filter CF, the electrode portions 11a, 12a, 13a, and 14a include the second electrode layer E2. Therefore, even if the external force acts on the multilayer common mode filter CF, the second electrode layer E2 reduces the external force. Stress tends not to occur in the element body 1. Consequently, the multilayer common mode filter CF suppresses occurrence of a crack in the element body 1.

In the multilayer common mode filter CF, the part of the conductive fillers FL is sintered with the first electrode layer E1 and is coupled to the first electrode layer E1. Therefore, the multilayer common mode filter CF has high connection strength between the first electrode layer E1 and the second electrode layer E2, as compared with a configuration in which the conductive fillers FL are not sintered with the first electrode layer E1 and are not coupled to the first electrode layer E1. Consequently, the multilayer common mode filter CF tends not to have interfacial delamination between the first electrode layer E1 and the second electrode layer E2. That is, the multilayer common mode filter CF suppresses occurrence of the interfacial delamination between the first electrode layer E1 and the second electrode layer E2.

A configuration in which the first electrode layer E1 and the plurality of conductive fillers FL are made of different metals may cause the following problem. When the first electrode layer E1 and the conductive filler FL are sintered, an alloy layer is formed between the first electrode layer E1 and the conductive filler FL. The alloy layer increases electric resistance between the first electrode layer E1 and the second electrode layer E2.

In the multilayer common mode filter CF, the first electrode layer E1 and the plurality of conductive fillers FL are made of the same metal. Therefore, the alloy layer tends not to be formed between the first electrode layer E1 and the conductive filler FL. Consequently, the multilayer common mode filter CF suppresses an increase in electric resistance between the first electrode layer E1 and the second electrode layer E2. In the multilayer common mode filter CF, the first electrode layer E1 and the plurality of conductive fillers FL are made of Ag.

As described above, the second electrode layer E2 reduces the external force acting on the element body 1, the external force being applied onto from the electronic device to the multilayer common mode filter CF. Therefore, the second electrode layer E2 suppresses occurrence of a crack in the element body 1. However, in the case in which the part of the conductive fillers FL is coupled to the first electrode layer E1, the external force tends to act on the first electrode layer E1. The external force acting on the first electrode layer E1 acts as stress on the element body 1. The stress acting on the element body 1 tends to concentrate on an edge of the first electrode layer E1. In the case in which the first electrode layer E1 is disposed on the mounting surface (the principal surface 1a or the principal surface 1b), a crack may occur in the element body 1, with an origin of the crack being the edge of the first electrode layer E1.

In the multilayer common mode filter CF, the first electrode layer E1 is not disposed on the principal surfaces 1a and 1b. The edge of the first electrode layer E1 is not located on the principal surfaces 1a and 1b. Therefore, the origin of the crack tends not to exist on the principal surfaces 1a and 1b. Consequently, the multilayer common mode filter CF reliably suppresses occurrence of a crack in the element body 1.

In the multilayer common mode filter CF, the second electrode layers E2 is disposed on the principal surfaces 1a and 1b. In the multilayer common mode filter CF, the external force applied onto the multilayer common mode filter CF from the electronic device tends not to act on the mounting surface (principal surface 1a or principal surface 1b). Therefore, the multilayer common mode filter CF more reliably suppresses the occurrence of the crack in the element body 1.

The multilayer common mode filter CF includes the coil conductors 21, 22, 23, and 24. The electrode portions 11c, 12c, 13c, 14c include the first electrode layer E1. The second electrode layer E2 included in each of the electrode portions 11c, 12c, 13c, and 14c is disposed on the element body 1 in such a manner that the first electrode layer E1 and the amorphous glass layer IL are interposed between the second electrode layer E2 and the element body 1. Each of the coil conductors 21, 22, 23, and 24 is electrically connected to the corresponding second electrode layer E2 through the corresponding first electrode layer E1. Therefore, in the multilayer common mode filter CF, connection strength between the coil conductors 21, 22, 23, and 24 and the respective terminal electrodes 11, 12, 13, and 14 is high, as compared with in a multilayer common mode filter in which each of the coil conductors 21, 22, 23, and 24 is directly connected with the corresponding second electrode layer E2. The coil conductors 21, 22, 23, and 24 and the respective terminal electrodes 11, 12, 13, and 14 are reliably electrically connected.

The multilayer common mode filter CF includes the amorphous glass layer IL. The amorphous glass layer IL is positioned between the edges A1, A2, A3, and A4 of the second electrode layers E2 and the surface of the element body 1, and is in contact with the edges A1, A2, A3, and A4 of the second electrode layers E2. The multilayer common mode filter CF suppresses delamination of the second electrode layers E2, as compared with a configuration in which a the edges A1, A2, A3, and A4 of the second electrode layers E2 is directly disposed on the element body 1.

In the multilayer common mode filter CF, the amorphous glass layer IL is formed on the surfaces (principal surfaces 1a and 1b) of the magnetic portions 5. The amorphous glass layer IL is disposed between the edges A1, A2, A3, A4 of the second electrode layers E2, and the surfaces of the magnetic portions 5, at the terminal electrodes 11, 12, 13, and 14. Even though the surface of the amorphous glass layer IL is smoother than the surface of the magnetic portion 1, the multilayer common mode filter CF suppresses delamination of the second electrode layer E2, as compared with a multilayer common mode filter in which the second electrode layer E2 is directly disposed on the magnetic portion 5.

In the multilayer common mode filter CF, the external electrode includes the plurality of terminal electrodes 11, 12, 13, and 14. Each of the terminal electrodes 11, 12, 13, and 14 includes the second electrode layer E2. In a configuration in which a plurality of terminal electrodes is disposed on the element body 1, the contact area between the second electrode layer E2 of each of the terminal electrodes and the element body 1 is small, as compared with a configuration in which the number of terminal electrodes is one. In a case in which the contact area between the second electrode layer E1 and the element body 1 is small, the second electrode layer E2 may delaminate from the element body 1.

In the multilayer common mode filter CF, the amorphous glass layer IL is disposed between the edges A1, A2, A3, and A4 of the second electrode layers E2, and the surfaces of the magnetic portions 5. Therefore, the second electrode layer E2 tends not to delaminate from the element body 1 (amorphous glass layer IL).

Figure 7:
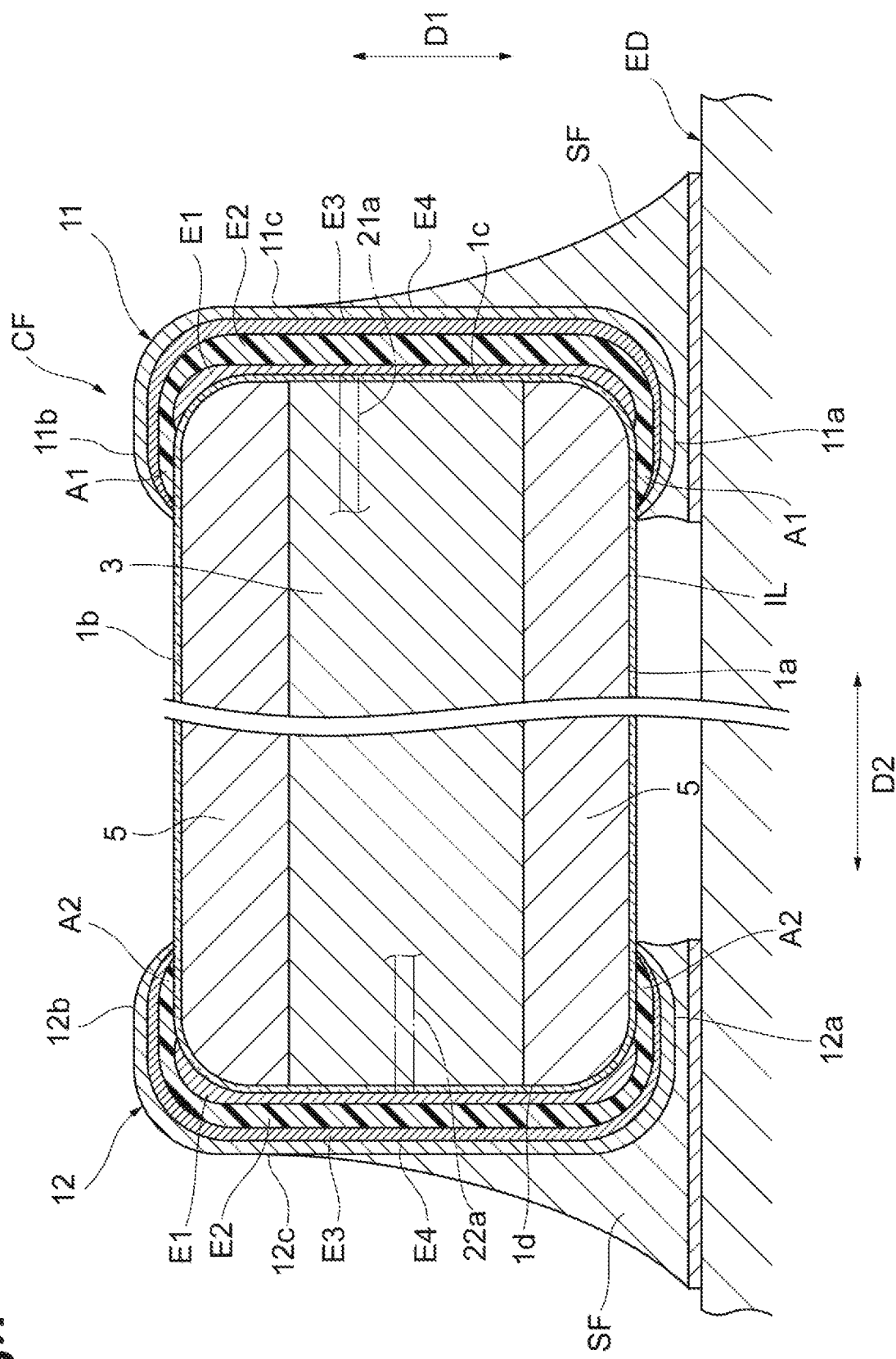
FIG. 7 is a view illustrating a mounting structure of the multilayer common mode filter according to the embodiment.
Figure 8:
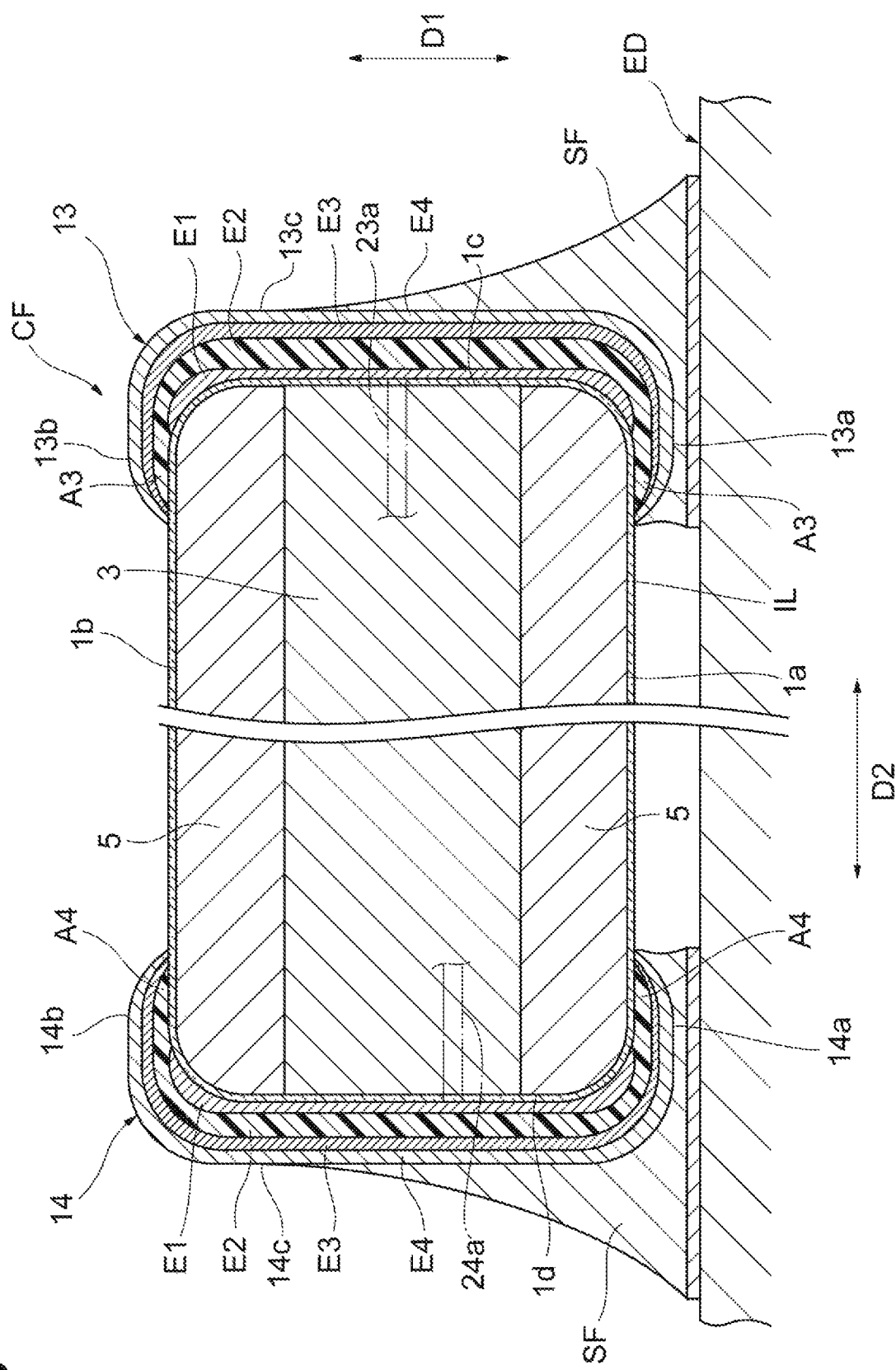
FIG. 8 is a view illustrating a mounting structure of the multilayer common mode filter according to the embodiment.

Next, a mounted structure of the multilayer common mode filter CF will be described with reference to FIGS. 7 and 8. FIGS. 7 and 8 are views illustrating mounting structures of the multilayer common mode filter according to the embodiment.

As illustrated in FIGS. 7 and 8, an electronic component device includes the multilayer common mode filter CF and an electronic device ED. The multilayer common mode filter CF is solder-mounted on the electronic device ED. The electronic device ED includes, for example, a circuit board or an electronic component. Solder fillets SF are formed on the terminal electrode 11, the terminal electrode 12, the terminal electrode 13, and the terminal electrode 14 by solidification of molten solder.

The electronic component device illustrated in FIGS. 7 and 8 tends not to have the interfacial delamination between the first electrode layer E1 and the second electrode layer E2, as described above. Therefore, the electronic component device suppresses occurrence of the interfacial delamination between the first electrode layer E1 and the second electrode layer E2.

For example, in case in which the multilayer common mode filter CF is solder-mounted on the electronic device ED in the state in which the principal surface 1a opposes the electronic device ED, external force applied onto the multilayer common mode filter CF from the electronic device ED tends to act as stress on the electrode portions 11a, 12a, 13a, and 14a. In a case in which the external force acts on the electrode portions 11a, 12a, 13a, and 14a, the second electrode layers E2 included in the electrode portions 11a, 12a, 13a, and 14a may delaminate from the element body 1 (amorphous glass layer IL).

In the multilayer common mode filter CF, the amorphous glass layer IL is disposed between the edges A1, A2, A3, and A4 of the second electrode layers E2, and the principal surface 1a. Therefore, the second electrode layers E2 tend not to delaminate from the element body 1 (amorphous glass layer IL) even in a case in which the multilayer common mode filter CF is mounted to the electronic device.

Figure 9:
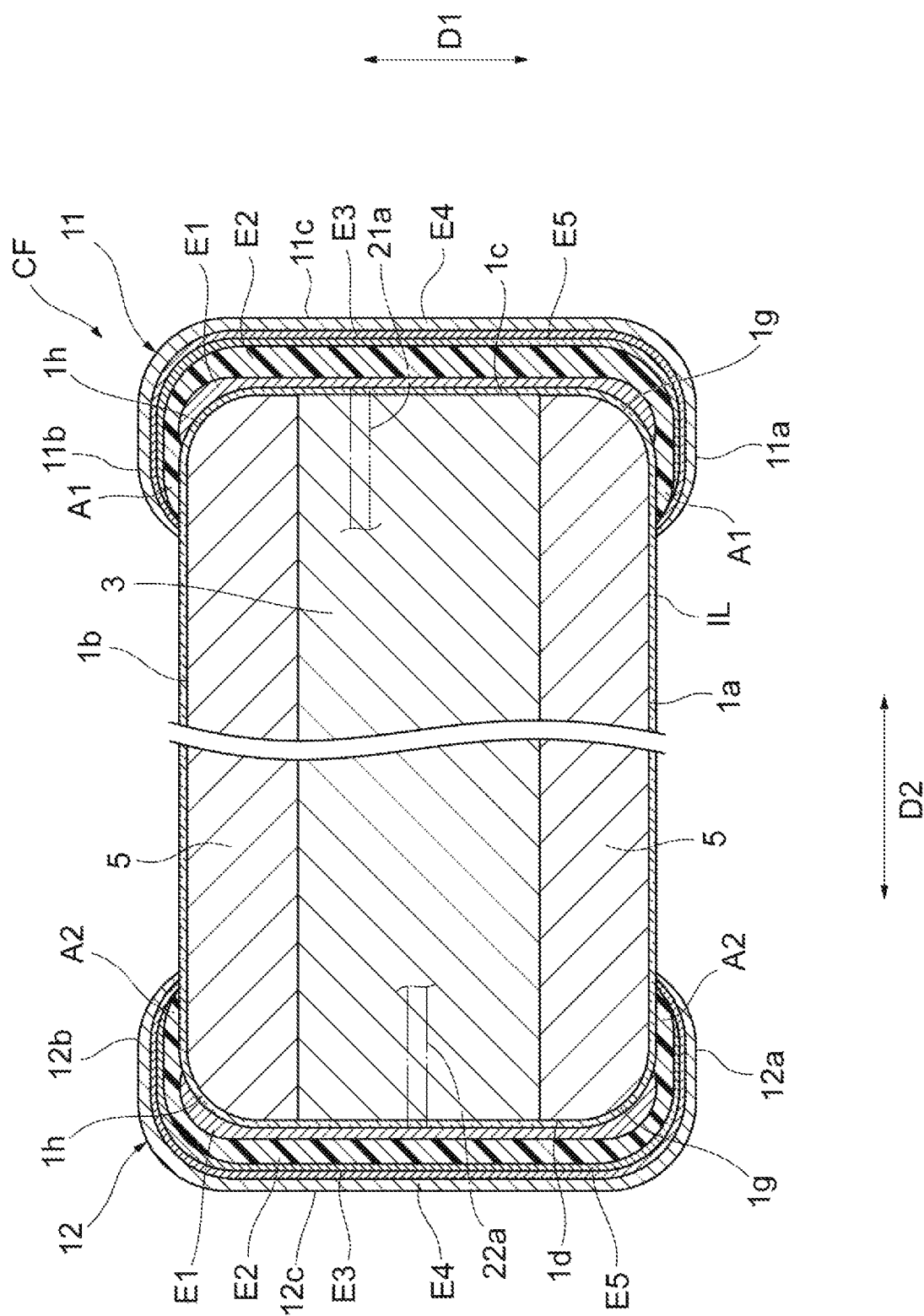
FIG. 9 is a view illustrating a cross-sectional configuration of the multilayer common mode filter according to a modification of the embodiment.

Next, configurations of multilayer common mode filter CF according to a modification of the embodiment will be described with reference to FIG. 9. FIG. 9 is a view illustrating a cross-sectional configuration of the multilayer common mode filter according to the modification. The cross-sectional configuration including the terminal electrode 13 and the terminal electrode 14 is the same as the cross-sectional configuration including the terminal electrode 11 and the terminal electrode 12 illustrated in FIG. 9, and thus illustration of the cross-sectional configuration including the terminal electrode 13 and the terminal electrode 14 is omitted.

The multilayer common mode filter CF according to the modification is generally similar or the same as the multilayer common mode filter CF according to the above-described embodiment, but the modification differs from the above-described embodiment in the configurations of the plating layers included in the terminal electrodes 11, 12, 13, and 14. Hereinafter, differences between the above-described embodiment and the modification will be mainly described.

In the multilayer common mode filter CF illustrated in FIG. 9, a fifth electrode layer E5 is disposed between the second electrode layer E2 and the third electrode layer E3. The fifth electrode layer E5 is formed on the second electrode layer E2 by a plating method. The fifth electrode layer E5 includes a plating layer. The fifth electrode layer E5 is a Cu plating layer formed by Cu plating method, for example. The third electrode layer E3 is formed on the fifth electrode layer E5 by a plating method. The fifth electrode layer E5 is in contact with the second electrode layer E2. The conductive fillers FL exposed to the surface of the second electrode layer E2 is in contact with the fifth electrode layer E5. The fifth electrode layer E5 is in contact with the third electrode layer E3.

In the present modification, the plating layer formed on the second electrode layer E2 has a three-layer structure. In each of the electrode portions 11a to 11c, 12a to 12c, 13a to 13c, and 14a to 14c, the entire second electrode layer E2 is covered with the plating layer laminated in the order of the fifth electrode layer E5, the third electrode layer E3, and the fourth electrode layer E4. The fifth electrode layer E5 is integrally formed in each of the electrode portions 11a to 11c, 12a to 12c, 13a to 13c, and 14a to 14c. An edge of the fifth electrode layer E5 is included in each of the electrode portions 11a, 11b, 12a, 12b, 13a, 13b, 14a, and 14b.

Although the embodiment and modification of the present invention have been described above, the present invention is not necessarily limited to the embodiment and modification, and the embodiment can be variously changed without departing from the scope of the invention.

The first electrode layer E1 and the plurality of conductive fillers FL may be made of different metals. In the case in which first electrode layer E1 and the plurality of conductive fillers FL are made of the same metal, the multilayer common mode filter CF suppresses the increase in electric resistance between the first electrode layer E1 and the second electrode layer E2, as described above.

The multilayer common mode filter CF may not include the amorphous glass layer IL. In this case, the terminal electrodes 11, 12, 13, and 14 are directly disposed on the element body 1. In the case in which the multilayer common mode filter CF includes the amorphous glass layer IL, the multilayer common mode filter CF suppresses delamination of the second electrode layer E2, as described above.

The terminal electrodes 11, 12, 13, and 14 do not necessarily include the electrode portions 11b, 12b, 13b, and 14b. The terminal electrode 11 and the terminal electrode 13 may be disposed only on the two surfaces (principal surface 1a and side surface 1c), and the terminal electrode 12 and the terminal electrode 14 may be disposed only on the two surfaces (principal surface 1a and side surface 1d).

The plating layer disposed on the second electrode layer E2 does not necessarily have a two-layer structure or a three-layer structure. The plating layer disposed on the second electrode layer E2 may be one layer or may have a multilayer structure of four or more layers.

The number of the terminal electrodes disposed on each of the end portions of the element body 1 in the second direction D2 is not limited to "two." The number of the terminal electrodes disposed on each of the end portions of the element body 1 in the second direction D2 may be "three or more".

In the multilayer common mode filters CF, a plurality of coil conductors configures one coil. However, one coil conductor may configure one coil. In a case in which one coil conductor configures one coil, both ends of the one coil conductor are connected to corresponding terminal electrodes. In the multilayer common mode filters CF, two coils are provided in the element body. However, the number of coils may be "three or more".

In the embodiment and the modification, the electronic components are the multilayer common mode filters CF. However, the electronic components to which the present invention can be applied are not limited to the multilayer common mode filters. An electronic component to which the present invention can be applied is, for example, a multilayer electronic component such as a multilayer capacitor, a multilayer inductor, a multilayer varistor, a multilayer piezoelectric actuator, a multilayer thermistor, a multilayer composite component, or an electronic component other than the multilayer electronic components.

What is claimed is:

1. An electronic component comprising:
    an element body; and
    an external electrode disposed on the element body,
    wherein the external electrode includes:
        an underlying metal layer disposed on the element body,
        a conductive resin layer containing a plurality of conductive fillers and disposed on the underlying metal layer, the conductive resin layer being in direct contact with the underlying metal layer, and
        a plating layer disposed on the conductive resin layer,
        a part of the plurality of conductive fillers is sintered with the underlying metal layer and is directly coupled to the underlying metal layer, and
        another part of the plurality of conductive fillers is exposed to a surface of the conductive resin layer and is in contact with the plating layer.

2. The electronic component according to claim 1, wherein the underlying metal layer and the plurality of conductive fillers are made of a same metal.

3. The electronic component according to claim 2, wherein the underlying metal layer and the plurality of conductive fillers are made of Ag.

4. The electronic component according to claim 1, wherein the element body includes a principal surface arranged to constitute a mounting surface, and
    the underlying metal layer is not disposed on the principal surface.

5. The electronic component according to claim 4, wherein the conductive resin layer is disposed on the principal surface.

6. The electronic component according to claim 1, further comprising an amorphous glass layer formed on a surface of the element body,
    wherein the amorphous glass layer is disposed between an edge of the conductive resin layer and the surface of the element body, and is in contact with the edge of the conductive resin layer.

* * * * *